United States Patent [19]
Johnson et al.

[11] Patent Number: 5,173,093
[45] Date of Patent: Dec. 22, 1992

[54] SINGLE SPRAY LEVEL FOR FLUE GAS DESULFURIZATION SYSTEM

[75] Inventors: Dennis W. Johnson, Barberton; Paul J. Lieb, Norton, both of Ohio

[73] Assignee: The Babcock & Wilcox Company, New Orleans, La.

[21] Appl. No.: 736,334

[22] Filed: Jul. 26, 1991

[51] Int. Cl.⁵ .............................. B01D 47/00
[52] U.S. Cl. ........................ 55/73; 55/220; 261/117
[58] Field of Search .............. 261/115–118, 261/124, 98; 55/220, 84, 73

[56] References Cited

U.S. PATENT DOCUMENTS

| | | | |
|---|---|---|---|
| 2,360,669 | 10/1944 | Goethal | 261/98 |
| 2,633,929 | 4/1953 | Farr | 55/242 |
| 3,912,469 | 10/1975 | Ewan et al. | 261/116 |
| 4,263,021 | 4/1981 | Downs et al. | 55/93 |
| 4,990,167 | 2/1991 | Stehning | 261/115 |

*Primary Examiner*—Bernard Nozick
*Attorney, Agent, or Firm*—Robert J. Edwards; Michael L. Hoelter

[57] ABSTRACT

This invention pertains to a single spray level within a flue gas desulfurization absorber tower. This spray level incorporates multiple headers with each header having a plurality of feeder lines connected thereto. These feeder lines extend within the flue gas flow path in an alternating and staggered configuration within the same plane. A series of nozzles are secured to each feeder line to spray a mixture onto the flue gas. Spare capacity, if required, is incorporated into the spray level.

17 Claims, 6 Drawing Sheets

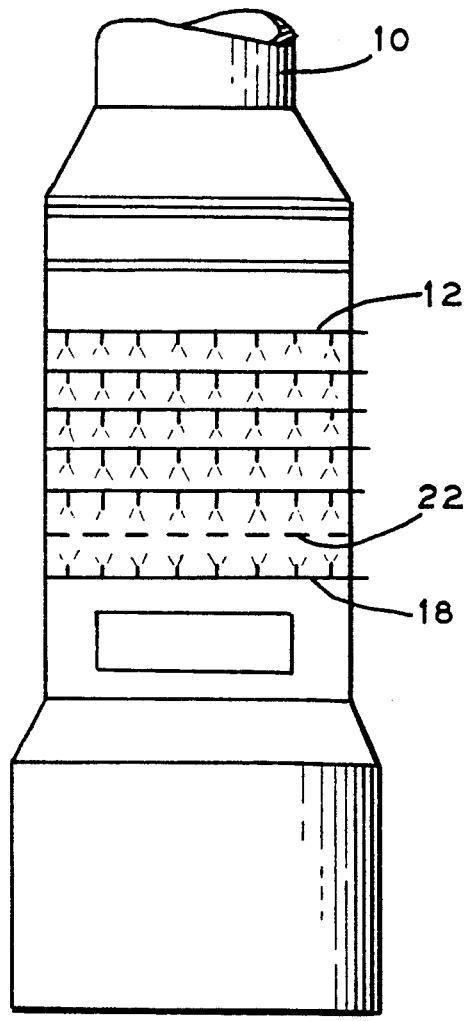
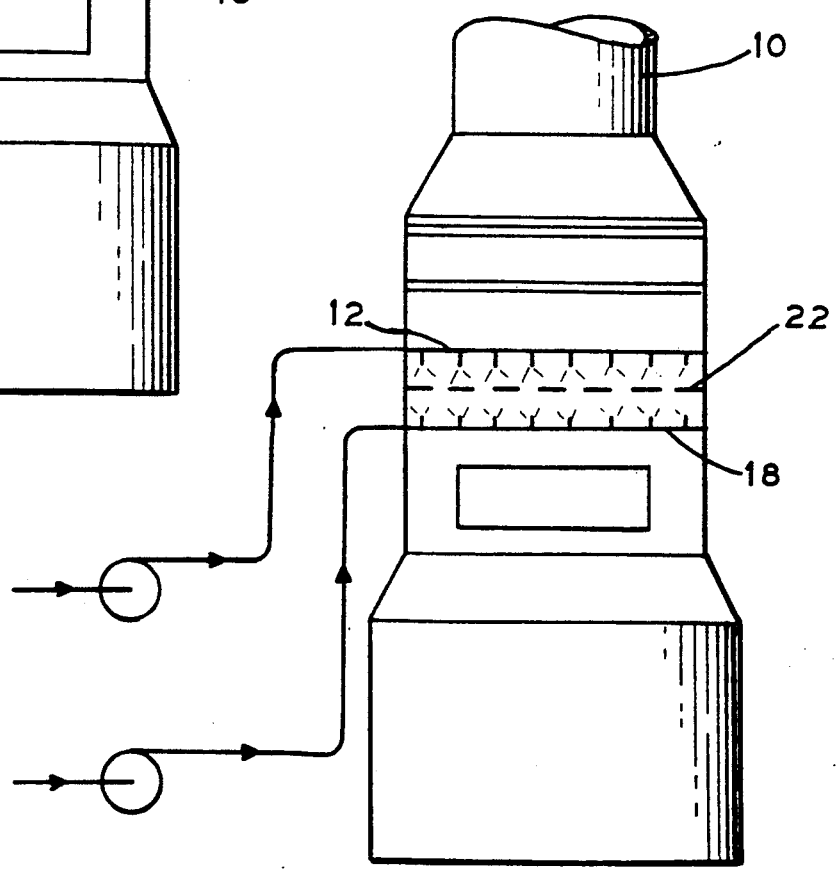

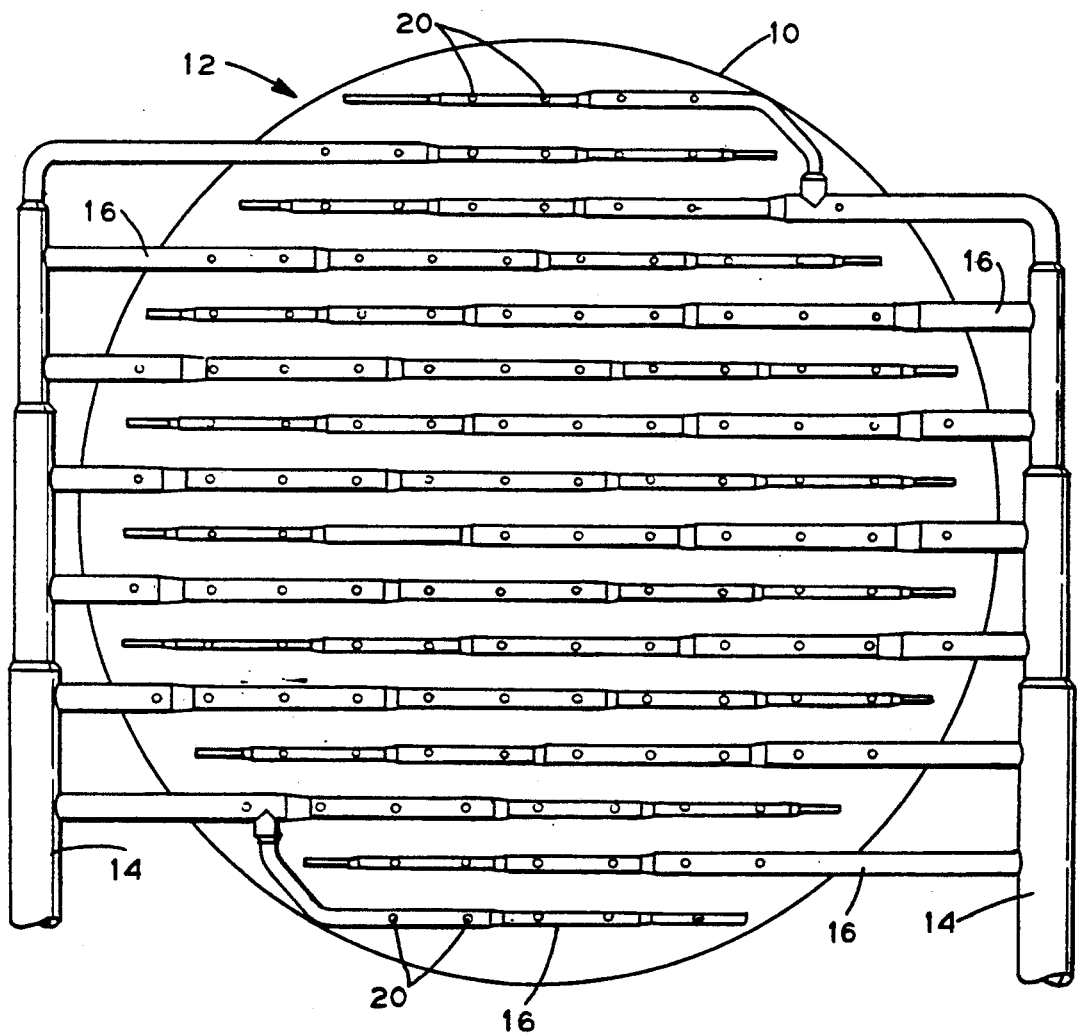

SINGLE SPRAY LEVEL FOR FLUE GAS DESULFURIZATION SYSTEM

FIELD OF THE INVENTION

This invention pertains to flue gas desulfurization and more particularly, to a means and method of achieving such desulfurization in a shorter absorber tower.

BACKGROUND OF THE INVENTION

Flue gas desulfurization (FGD) occurs primarily in the flue gas absorber tower by means of spraying the flue gas with a mixture which causes the sulfur to precipitate out. This spraying is accomplished by installing spray headers across the tower opening directly in the flue gas path. In early systems, which were typically small, a single spray level was all that was needed because of the low gas flow rates. However, as systems became larger, the flue gas flow rates increased and the spray volume was increased up to pump capacity until additional spray levels were required.

The addition of spray levels is resisted because each level increases the absorber tower height by up to five feet or more and this can be critical in closely confined quarters. However, despite this reluctance, the ultimate need is dictated by the flue gas flow rate and the desire to remove as much sulfur as possible before releasing these gases to the atmosphere. Thus, it became quite common for a FGD system to incorporate five or more spray levels to accommodate the flue gas volume and sulfur density. Unfortunately, however, this caused the absorber tower to be raised in height about twenty feet or more with these multiple spray levels requiring a corresponding increase in pumping and piping requirements. Thus, to accommodate greater flue gas capacity, the tower height (as well as diameter) had to be increased which required more pumping power.

In addition to these multiple spray levels, there is also a need in some systems for a spare spray level which is to be utilized when one of the other levels is out of commission or being repaired. This only adds to the cost and height of the absorber tower.

In some cases, the FGD system incorporates a high liquid to gas (L/G) ratio as compared to the more common use of low ratios in other systems. The L/G ratio is a reference to liquid flow rate relative to gas volume whose units are gallon per minute per 1000 actual cubic feet per minute (gpm/macfm). This L/G ratio is determined by a number of process variables including reagent type, pH, solids particle size, reactivity, chloride ion concentration, sulfur dioxide concentration, sulfur dioxide removal, reagent utilization, spray drop size, etc. A high L/G implies a high liquid flow rate relative to gas volume which is typically a value of 40 to 140 or more. Consequently, a low L/G ratio would generally be a value of less than 20. One way of accomplishing a high L/G ratio is by simply adding more spray levels to the absorber tower so that more of the mixture can be sprayed onto the flue gas. This, however, does not eliminate the need for a taller tower nor does it diminish the need for more pumping power so that the mixture can be delivered at the higher elevation.

Since every foot of absorber tower height is costly, and since each bit of energy needed to deliver the mixture to its assigned elevation must be paid for, it is desirable to both cut the absorber tower height and reduce the energy requirements on each FGD system installed. It is thus an object of this invention to provide a system that both reduces absorber tower height and lowers energy costs. It is another object of this invention to provide an FGD system that can incorporate a spare spray without also increasing absorber tower height. These and other features of this invention are set out below.

SUMMARY OF THE INVENTION

This invention pertains to a single spray level for a flue gas desulfurization absorber tower that consists of one or more headers secured adjacent the tower. A plurality of elongated feeder lines are secured to each of these headers with these feeder lines from each header being staggered with respect to each other so as to alternately extend across the flue gas flow path. These feeder lines also extend within the same, or nearly the same, plane within the tower. Multiple nozzles are secured to each of these feeder lines with these nozzles being configured to spray onto the flue gas within the tower.

BRIEF DESCRIPTION OF THE DRAWINGS

FIG. 1 is a pictorial view, partially broken away, of a typical flue gas absorber tower illustrating the multiple spray levels normally incorporated therein.

FIG. 2 is a pictorial view, partially broken away, of the invention illustrating the singly spray level disclosed herein.

FIG. 7 is a plan view, partially broken away, of an alternate embodiment of a single spray level having only two headers.

DETAILED DESCRIPTION OF THE DRAWINGS

Referring initially to FIG. 1, there is shown a typical absorber tower 10 for a 500 MW flue gas desulfurization system. This typical tower extends about 121 feet above the ground and is about 60 feet in diameter. It encloses multiple spray levels 12 with each such level usually being a duplicate of the one above and below it and with about 5 feet of space between each level.

In this prior art, the multiple levels 12 were needed so that the entire are of absorber tower 10 could be covered by the spray and so that the liquid to gas flow rate (L/G) necessary to cause the desired sulfur dioxide capture could be delivered by independent large capacity pumps. It is this spray that causes the sulfur in the flue gas to fall out thus the requirement that the spray be in contact with all of the flue gas for the system to work.

In contrast to this typical structure, FIG. 2 discloses the present invention which only requires a single spray level for operation. This single spray level 12 requires a structure that is also about 60 feet in diameter but which extends only about 97 feet above the ground—a savings of about 24 feet in absorber tower height! Furthermore, the design of this invention still accomplishes the objective of spraying the entire flue gas for sulfur removal while also incorporating spare spray capacity should such be needed.

Figure 3:
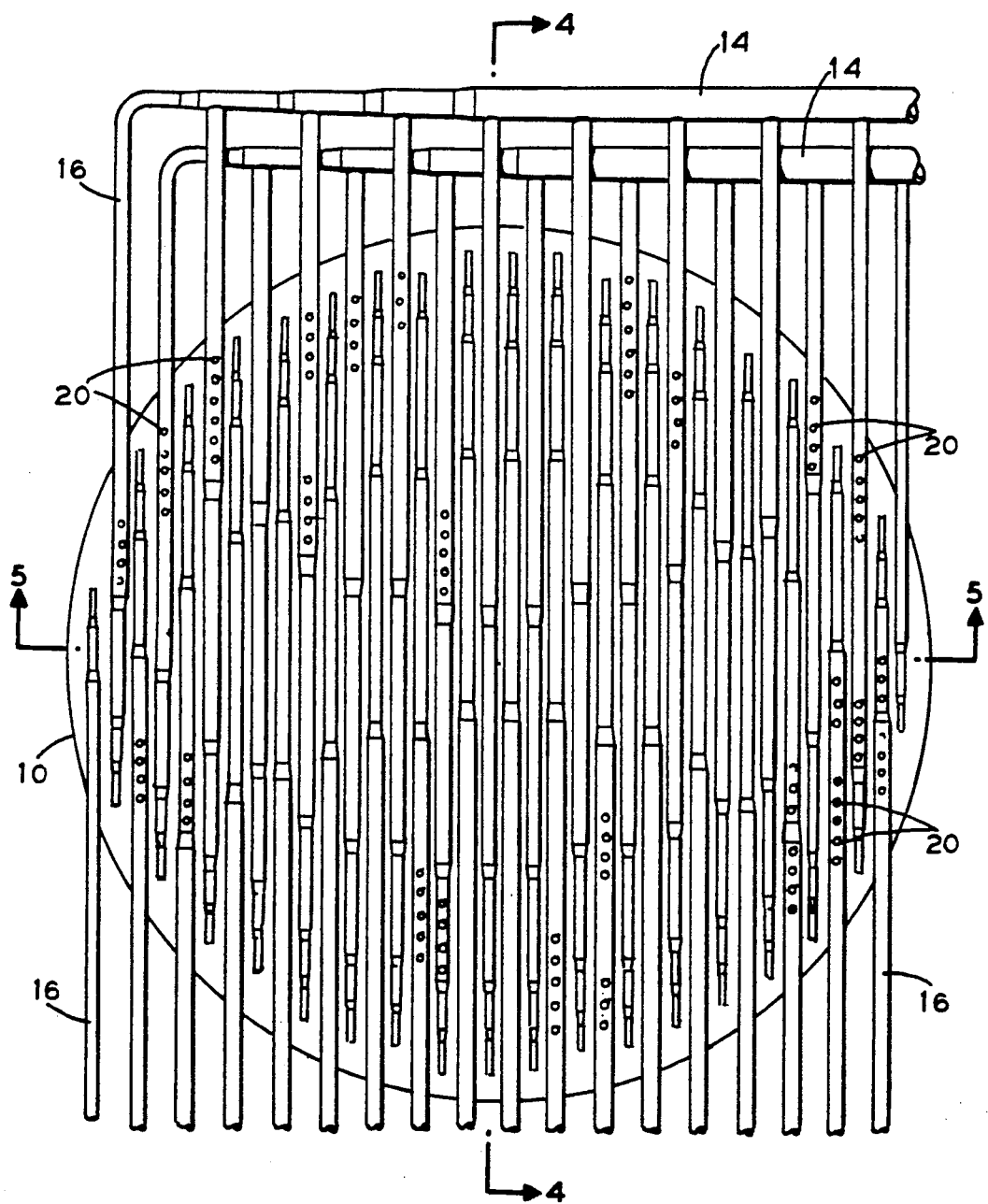
FIG. 3 is a plan view, partially broken away, of the single spray level disclosed herein.
Figure 4A:
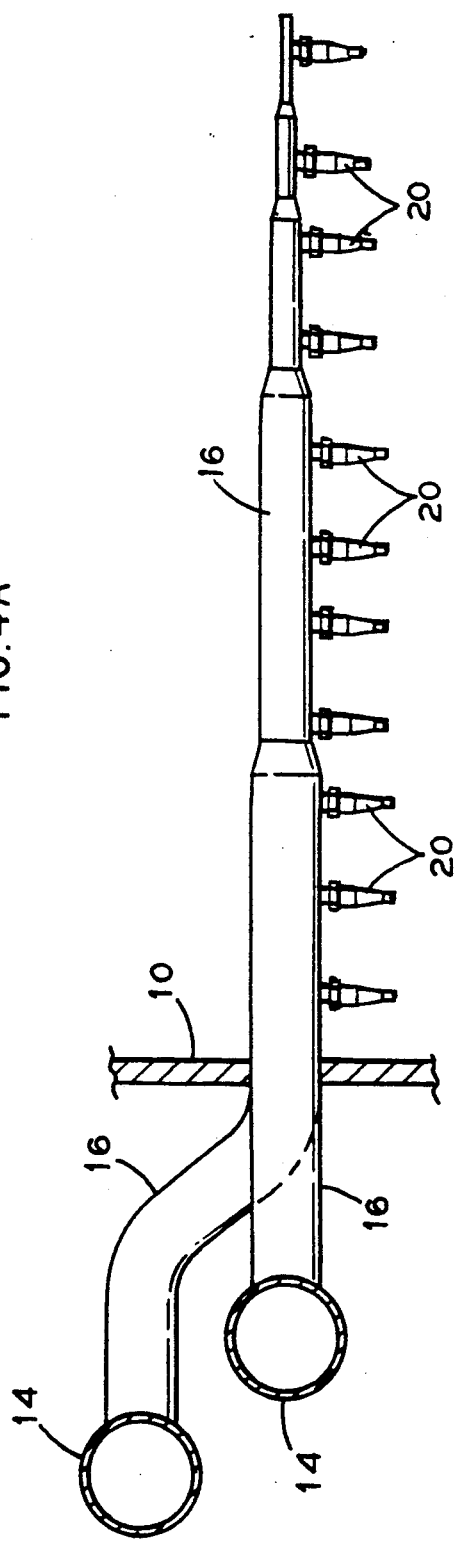
FIGS. 4a through 4c are a sectional views, partially broken away and taken along lines 4—4 of FIG. 3, which illustrate possible locations for the headers.
Figure 4C:
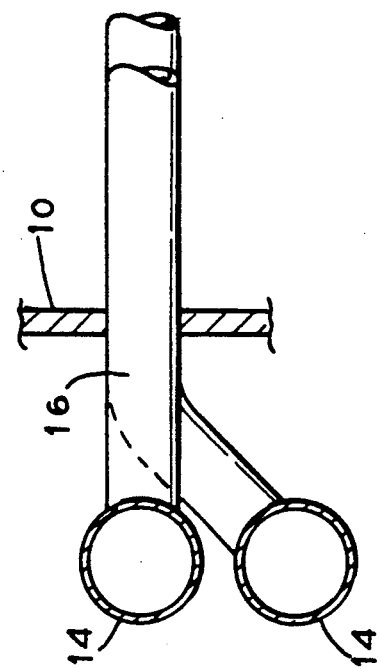
Figure 4B:
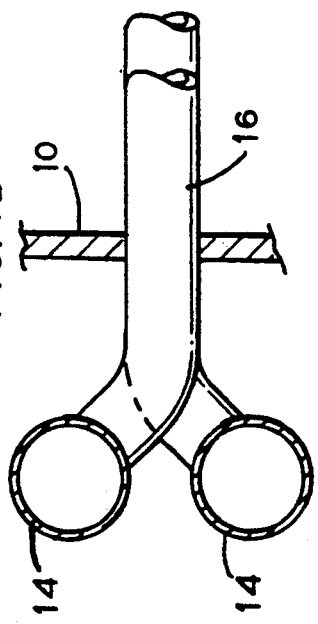
Figure 5:
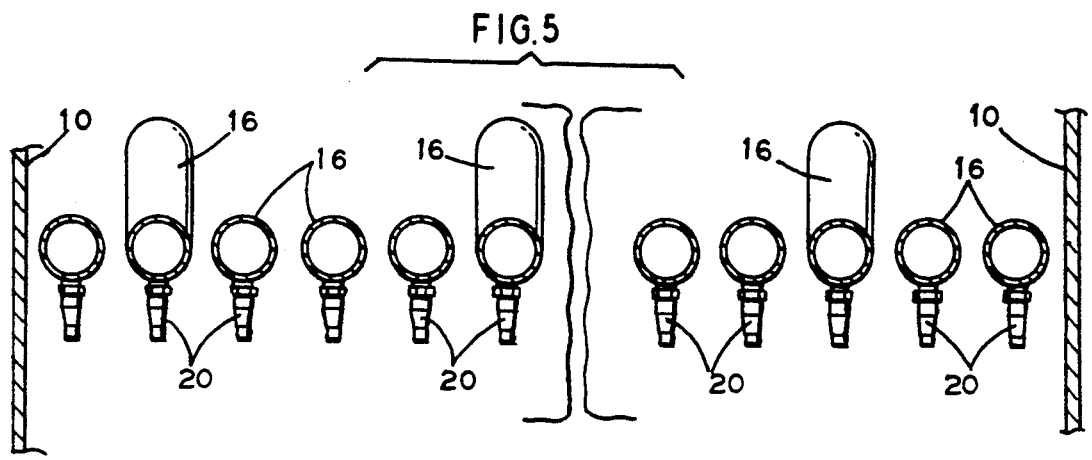
FIG. 5 is a sectional view, partially broken away, taken along lines 5—5 of FIG. 3.

Turning now to FIGS. 3 through 5, it is disclosed how this reduction in absorber tower height is accomplished. In this embodiment, the single spray level 12 consists of four separate external headers 14 each having a number of parallel feeder lines 16 connected thereto. These individual feeder lines 16 are reduced or become smaller in diameter the farther they extend from their respective header 14 (see FIG. 4). This reduction is to accommodate the drop in fluid flow that occurs in each feeder line 16 as it extend across absorber tower 10. The purpose here is to maintain as constant a pressure as possible along the length of each feeder line 16 and to maintain reasonable line velocities. Also, it should be noted that each header 14 becomes smaller in diameter along its length for many of the same reasons.

As indicated, this embodiment encompasses two headers 14 on opposite sides of absorber tower 10 (there being a total of four such headers 14 in this embodiment). The opposite sides of this invention are essentially mirror images (basically the same but rotated 180 degrees) of each other. Each header pair on the same side of absorber tower 10 is vertically, and sometimes horizontally, spaced a slight distance from each other. This is so that the feeder lines 16 from that side (and preferably from both sides) will extend within the same plane within absorber tower 10.

In FIG. 4a, lower header 14 lies in the desired plane while the upper header 14 is both horizontally and vertically offset from the lower header 14. This requires the feeder lines of upper header 14 to incorporate fittings therein so that they will lie in the same plane as the feeder lines 16 from lower header 14. In FIG. 4b, the plane of feeder lines 16 lies between both headers 14 thereby requiring each feeder line to be oriented accordingly. In FIG. 4c, it is the upper header which lies in the plane of the feeder lines. In any event, no matter how headers 14 are oriented, feeder lines 16 are constructed to extend within the same plane, be coplanar, within absorber tower 10 as shown in FIG. 5. The design of the FGD system will determine the number of pumps and headers 14 required. The combination shown is for two headers 14 per side. Other combinations include two headers 14 on one side and one on the other, or three on one side and none on the other, or any other combination of from zero to four headers 14 on each of the opposite sides of tower 10.

Referring now to FIG. 3, these respective feeder lines 16 are staggered so as not to duplicate coverage within absorber tower 10. The opposite side of absorber tower 10 contains essentially a duplicate of this set-up rotated 180 degrees with the feeder lines 16 from all four headers 14 being at the same (or nearly the same) elevation within absorber tower 10. In this interlocking and staggered fashion, the entire area within absorber tower 10 is covered by spray from each of headers 14 and feeder lines 16 that are operating. In actuality, however, there is considerable overlapping of spray area such that any one whole header 14 and its respective feeder lines 16 could be removed from service and treated as the spare if need be without affecting sulfur removal. That is, the spray from only three headers are required to achieve the desired sulfur removal so that any one of the four headers 14 can be out of service without affecting sulfur removal. Headers 14 can be oriented in a manner such that they are fed from either end or any point along their length. Generally, headers 14 are made larger at their feed point and become reduced as described earlier.

The spray configuration now disclosed can be used for any wet FGD system including dual alkali, magnesium promoted lime or limestone, limestone, limestone forced oxidation, lime, sodium etc. The advantage herein being that tower height is reduced and overall power consumption is less than with those systems having multiple spray levels 12. Also, spare capacity is retained without the need for a separate spray level 12.

It should also be noted that each header 14 is typically connected to its own pump (not shown) so as to be independent of each of the other headers 14. In this fashion, should it be desirable to have spray coming from only two headers 14, the other two header pumps can be shut down without affecting the spray velocity or flow of the two headers 14 still in service. Additionally, should problems occur in one of the systems, it can be removed from service till the problem is solved without affecting the overall operation of absorber tower 10. Also, since all the headers 14 are at the same elevation, less pumping power demand is required with this invention as compared to absorber towers having multiple spray levels. This is because with this invention, each pump need only lift the mixture to one elevation, which is the lowest elevation, rather than to successively higher and higher elevations as would be required for a tower with multiple spray levels.

Ideally, this invention would be top supported or self supported so as to eliminate any wear occurring due to spray impingement but it can also be bottom supported. Additionally, the material used for construction (including materials for the nozzles) can be of any desired composition that is suitable for the environment within absorber tower 10. The construction of the headers can be by any appropriate means including flanged, welded, glued, threaded, etc. This invention is also suitable for use with or without a gas distribution device, tray, quench, presaturator, or underspray assembly 18 as shown. In FIGS. 1 and 2, tray 22 is also illustrated. In the event that underspray assembly 18 is used, spare capacity could be incorporated into underspray assembly 18 in much the same manner as described above.

Figure 6A:
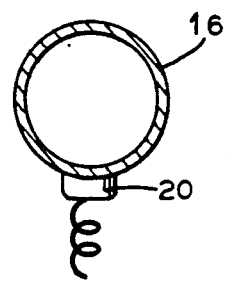
FIGS. 6a through 6e are schematic diagrams of some of the various nozzles that can be incorporated into this invention.
Figure 6B:
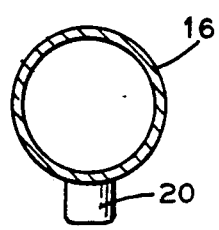
Figure 6C:
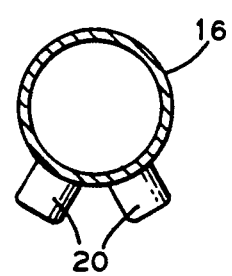
Figure 6D:
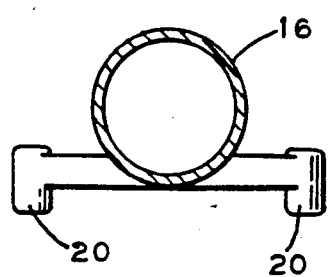
Figure 6E:
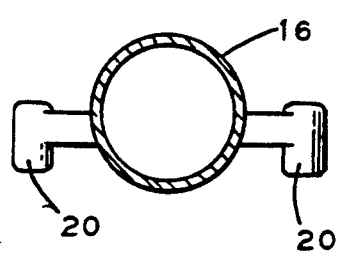

Referring now to FIGS. 6a through 6e, there is shown a sample collection of the nozzles 20 available for use on feeder lines 16. FIG. 6a illustrates a single spiral type nozzle while FIG. 6b shows a single straight nozzle. FIGS. 6c, 6d, and 6e respectively show double spiral (or straight) nozzles, double right angle nozzles with an eccentric connection to feeder line 16, and double right angle nozzles tangentially connected to feeder line 16. Of course, the number of nozzles, type, and arrangement is a function of the desired FGD design and desired spare capacity. Overall coverage is improved as nozzles 20 are positioned closer to each other. In the embodiment shown, spare capacity of 25% is achieved due to feeder line 16 and nozzle 20 location. In some systems, it is not uncommon to have a total of about 250 nozzles per header 14 thereby implying that there would be a total of about 1,000 nozzles in the entire system. These nozzles can be flanged, glued, welded, or screwed onto feeder lines 16 as needed and can be oriented to spray upward, downward, or at any sideways angle.

It is also to be considered within the realm of this invention to utilize this design with internal headers rather than the external headers 14 shown. As can be presumed, external headers have their manifolding outside absorber tower 10 while internal headers normally have only one absorber tower penetration with multiple branch lines internal to the absorber to assure full coverage.

While it may appear from the plan view of FIG. 3 that nearly the entire area within absorber tower 10 is blocked by feeder lines 16, this is not the case. In reality, this symmetrical design configuration has a free passage open area of almost 50%. Additionally, should such be desired, it would be possible to construct a absorber tower 10 with two or three separate spray levels 12 as disclosed while still retaining the advantage of a shorter absorber tower and lower power consumption. Spare capacity would be incorporated in either of the two or three separate spray levels while still maintaining overall coverage. In this case, the two or three separate spray levels can be stacked above each other so as to appear exactly the same when viewed from the top or the spray levels could be rotated at any angle appropriate for the arrangement. If spare capacity is incorporated into underspray header 18, typically it will have two supply headers 14 with one of these being a spare. The orientation of underspray header 18 incorporating spare capacity can be independent of the orientation of the one to three separate spray levels 12.

Figure 8:
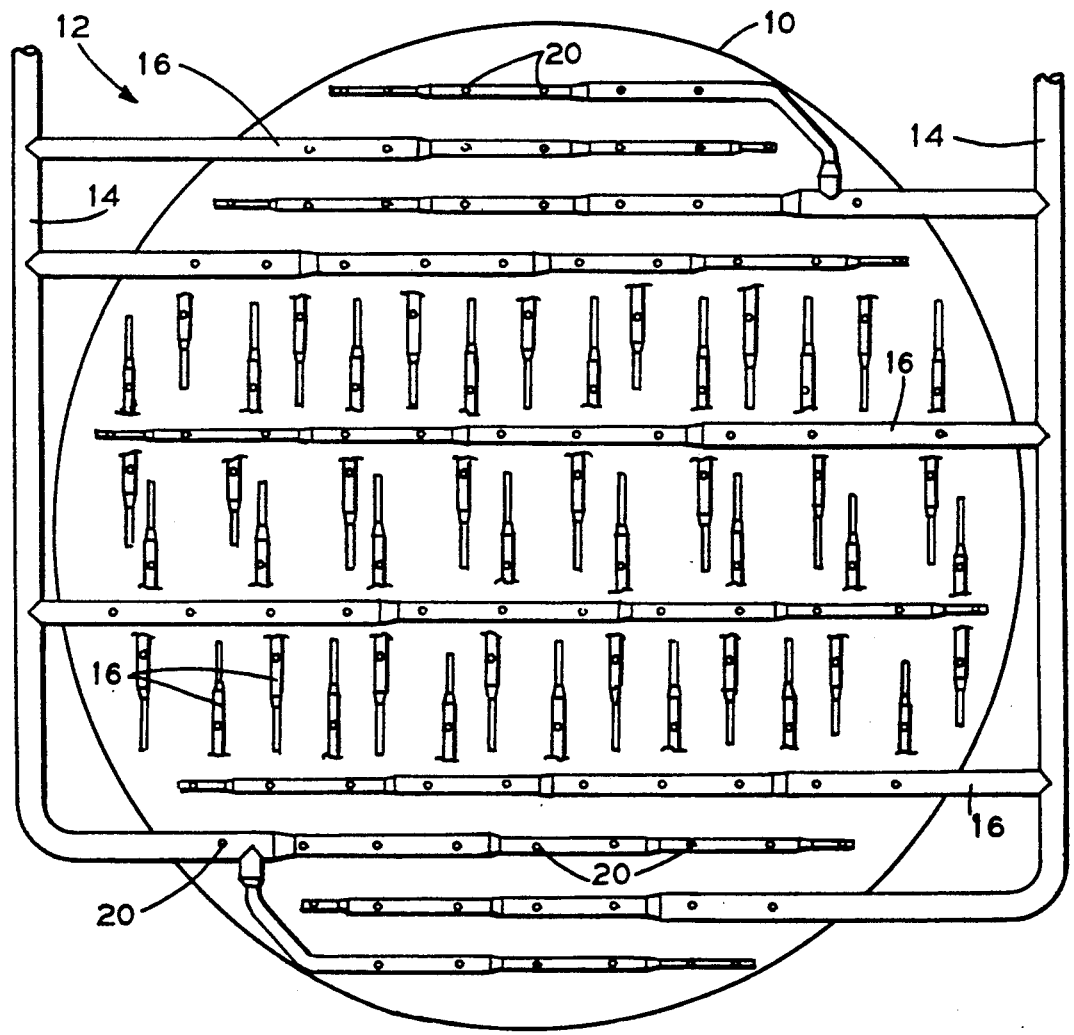
FIG. 8 is a plan view, partially broken away, of still another alternate embodiment of a single spray level having only two headers.

Referring now to FIGS. 7 and 8, there is shown a single spray level 12 of a different configuration than described above. These spray levels 12 utilize only two headers 14 rather than the four described earlier. They also configure feeder lines 16 differently. These and many other designs of spray level 12 are possible in accordance with this invention, the two designs shown in FIGS. 7 and 8 merely being representative of the variations possible.

What is claimed is:

1. A method of spraying sulfur containing flue gas with a liquid absorbent in a flue gas desulfurization absorber tower having a flue gas inlet and outlet, comprising the steps of:
   (a) securing at least two headers to the tower for supplying the liquid absorbent to the tower;
   (b) attaching multiple feeder lines to each said header, said feeder lines from each said header extending into the tower and being staggered so as to alternately extend across the flue gas flow path within the same, or nearly the same, plane within the tower;
   (c) securing a series of nozzles to each said feeder line within the tower;
   (d) spraying the liquid absorbent through said nozzles onto the flue gas within the tower thereby desulfurizing the flue gas; and,
   (e) discharging a flue gas with low sulfur content from the flue gas outlet.

2. The method as set forth in claim 1 further comprising the step of locating at least two said headers on the same side of the tower.

3. The method as set forth in claim 2 wherein both said headers on the same side are vertically offset with respect to each other.

4. The method as set forth in claim 1 further comprising the step of locating both said headers on opposite sides of the tower.

5. The method as set forth in claim 4 wherein there are a total of four said headers, two of each on opposite sides of the tower.

6. The method as set forth in claim 5 wherein at least two of the said headers located on opposite sides of the tower are coplanar.

7. One or more spray levels for spraying a liquid absorbent onto flue gas flowing through a flue gas desulfurization absorber tower having a flue gas inlet and outlet, each said spray level comprising:
   (a) at least two elongated headers secured adjacent a tower for supplying the liquid absorbent to said tower;
   (b) a plurality of elongated feeder lines secured to each said header and extending within said tower, the said feeder lines from the said headers being staggered so as to alternately extend across the flue gas flow path within the same, or nearly the same, plane within said tower; and,
   (c) a plurality of nozzles secured to each said feeder line, said nozzles being configured to spray the liquid absorbent onto the flue gas within said tower.

8. The apparatus as set forth in claim 1 further comprising a pump assembly for supplying each said header with liquid absorbent.

9. The apparatus as set forth in claim 8 wherein each said header and its respective said feeder lines decrease in diameter along their length.

10. The apparatus as set forth in claim 9 wherein at least one said header is coplanar with respect to said plane in said tower.

11. The apparatus as set forth in claim 9 wherein both said headers are coplanar with respect to said plane in said tower.

12. The apparatus as set forth in claim 9 wherein said headers are located outside said tower.

13. The apparatus as set forth in claim 9 wherein at least two said headers are located on the same side of said tower.

14. The apparatus as set forth in claim 13 wherein said headers on the same side of said tower are vertically offset with respect to each other.

15. The apparatus as set forth in claim 9 wherein said headers are located on opposite sides of said tower.

16. The apparatus as set forth in claim 15 wherein there are four said headers, two each on opposite sides of said tower.

17. The apparatus as set forth in claim 16 wherein at least two of the said headers located on opposite sides of said tower are coplanar.

* * * * *